United States Patent
Peng et al.

(10) Patent No.: US 7,977,254 B2
(45) Date of Patent: Jul. 12, 2011

(54) METHOD OF FORMING A GATE INSULATOR IN GROUP III-V NITRIDE SEMICONDUCTOR DEVICES

(75) Inventors: Lung-Han Peng, Taipei (TW); Han-Ming Wu, Pingjhen (TW); Jing-Yi Lin, Tuku Township, Yunlin County (TW)

(73) Assignee: Tekcore Co., Ltd., Nantou (TW)

( * ) Notice: Subject to any disclaimer, the term of this patent is extended or adjusted under 35 U.S.C. 154(b) by 1049 days.

(21) Appl. No.: 12/931,361

(22) Filed: Jun. 27, 2007

(65) Prior Publication Data

US 2011/0124203 A1 May 26, 2011

Related U.S. Application Data

(62) Division of application No. 11/005,193, filed on Dec. 6, 2004, now Pat. No. 7,253,061.

(51) Int. Cl.
*H01L 21/31* (2006.01)

(52) U.S. Cl. . 438/770; 438/771; 438/782; 257/E21.082; 257/E21.282; 257/E21.287

(58) Field of Classification Search .......... 438/765, 438/770, 771, 782; 257/E21.082, E21.282, 257/E21.287, E21.291; 204/157.46, 157.41, 204/157.5

See application file for complete search history.

(56) References Cited

U.S. PATENT DOCUMENTS 6,190,508 B1 * 2/2001 Peng et al. .............. 204/157.46

* cited by examiner

*Primary Examiner* — Julio J Maldonado
(74) *Attorney, Agent, or Firm* — David I. Roche; Baker & McKenzie LLP

(57) ABSTRACT

A method of forming a gate insulator in the manufacture of a semiconductor device comprises conducting a photo-assisted electrochemical process to form a gate-insulating layer on a gallium nitride layer of the semiconductor device, wherein the gate-insulating layer includes gallium oxynitride and gallium oxide, and performing a rapid thermal annealing process. The photo-assisted electrochemical process uses an electrolyte bath including buffered CH3COOH at a pH between about 5.5 and 7.5. The rapid thermal annealing process is conducted in O2 environment at a temperature between about 500° C. and 800° C.

10 Claims, 2 Drawing Sheets

METHOD OF FORMING A GATE INSULATOR IN GROUP III-V NITRIDE SEMICONDUCTOR DEVICES

CROSS-REFERENCE TO RELATED APPLICATIONS

This application is a division of U.S. patent application Ser. No. 11/005,193 filed Dec. 6, 2004 now U.S. Pat. No. 7,253,061.

FEDERALLY SPONSORED RESEARCH OR DEVELOPMENT

Not Applicable.

FIELD OF THE INVENTION

The present invention generally relates to the manufacture of semiconductor devices, and more specifically to a method of forming a gate insulator in semiconductor devices and, particularly, group III-V nitride semiconductor devices.

DESCRIPTION OF THE RELATED ART

Electronic devices based on group nitride compound semiconductors, and particularly gallium nitride (GaN) semiconductors, have been subject to intensive researches and developments in the field of electronic industry. Principal characteristics of GaN semiconductors include high electron mobility and saturation velocity (about $2.5 \times 10^7$ cm/s), and high breakdown electric field (about $5 \times 10^6$ V/cm), which make the GaN semiconductor particularly advantageous in high-power and high-temperature applications.

In a GaN-based semiconductor device, the GaN semiconductor layers are conventionally grown over a substrate. To ensure good performances of the semiconductor device, it is known that the crystalline quality of the GaN semiconductor layers deposited is a determining factor to electron mobility and velocity. In addition, using an adequate gate-insulating material can improve the performance of the GaN semiconductor device by reducing the gate leakage to a minimal level. In this regard, many approaches are presently implemented with various successes.

One approach is to use silicon-based dielectric materials such as silicon oxide ($SiO_2$) or silicon nitride ($Si_3N_4$) to make the gate-insulating layer. A gate-insulating layer made of the silicon-based dielectric can ensure a larger voltage swing and a higher drain current density in the semiconductor device. However, a disadvantage of $SiO_2$ or $Si_3N_4$ is its relatively low dielectric constant (about 3.9 for $SiO_2$, and about 7.5 for $Si_3N_4$), which can cause a premature breakdown of the dielectric layer when the field effect transistor is operated at a high power voltage.

To overcome the above issues, magnesium oxide (MgO) or scandium oxide ($Sc_2O_3$) are also possible alternatives for the gate-insulating layer. Owing to their higher dielectric constant (9.8 for MgO and 14 for $Sc_2O_3$), MgO and $Sc_2O_3$ can alleviate adverse breakdown of the gate-insulating layer under high operating power of the GaN semiconductor device. However, these dielectric materials are subject to undesirable thermal degradation due to a high interface state density of $10^{12}$ cm$^{-2}$·eV$^{-1}$. This reflects a high crystal defect density, which seriously limits the device performance.

Another known approach uses gallium oxide ($Ga_2O_3$) to form the gate-insulating layer. A $Ga_2O_3$ gate-insulating layer can form an isovalently bonded $Ga_2O_3$/GaN interface, which contributes to reduce the interfacial defect density. Additionally, $Ga_2O_3$ has a wide bandgap of 4.7 eV and a dielectric constant of 10, which results in a high breakdown field. These characteristics make $Ga_2O_3$ a good candidate for the gate insulator of group III-V nitride semiconductor devices.

However, experiments show that the $Ga_2O_3$ film quality, being characterized by its gate leakage, breakdown field and interface state density, variously depends on the preparation methods implemented, typically a thermal oxidation or a deposition by sputtering, and consequently depends on the film thickness and roughness and its post growth treatment. To remedy this downside, a stack structure of $SiO_2/Ga_2O_3/$GaN has been proposed to improve the interfacial quality. However, it has been shown that the electrical characteristics of such stack device structure are strictly determined by the effective thickness of the $SiO_2$ layer, regardless of the presence of the $Ga_2O_3$ interlayer. Consequently, the same issues related to $SiO_2$ as discussed above can be observed in the dielectric structure $SiO_2/Ga_2O_3/$GaN.

The foregoing problems encountered in the prior art call for an improved manufacturing method capable of providing a gate-insulating layer with improved characteristics in metal-oxide-semiconductor devices and, more particularly, group III-V nitride semiconductor devices.

SUMMARY OF THE INVENTION

The application describes a method of forming a gate insulator made of an oxide compound in the manufacture of a semiconductor device.

In an embodiment, the semiconductor device is a group III-V nitride semiconductor device and the oxide compound of the gate insulator includes gallium oxide formed from a gallium nitride layer of the group III-V nitride semiconductor device. The manufacturing method comprises conducting a photo-assisted electrochemical process to form a gate-insulating layer on the gallium nitride layer, wherein the gate-insulating layer includes gallium oxynitride and gallium oxide, and performing a rapid thermal annealing process. The gallium oxynitride is formed with a graded composition between the n-type gallium nitride layer and the gallium oxide layer.

In an embodiment, the photo-assisted electrochemical process includes electrically connecting the substrate to an electrometer, immersing the substrate in an electrolyte bath including acetic acid ($CH_3COOH$), and emitting a radiation light onto the substrate. In an embodiment, the radiation light has a wavelength between about 250 nm and 260 nm.

In an embodiment, the rapid thermal annealing process is performed in $O_2$ environment, and the rapid thermal annealing process is performed at a temperature between about 500° C. and 800° C.

The foregoing is a summary and shall not be construed to limit the scope of the claims. The operations and structures disclosed herein may be implemented in a number of ways, and such changes and modifications may be made without departing from this invention and its broader aspects. Other aspects, inventive features, and advantages of the invention, as defined solely by the claims, are described in the non-limiting detailed description set forth below.

DETAILED DESCRIPTION OF THE EMBODIMENT(S)

The present application describes a method of forming a gate insulator made of an oxide compound in the manufacture of a semiconductor device. In the embodiments herein, gallium oxide is described as a particular instance of the oxide compound since gallium oxide can be advantageously used as gate insulator for GaN-based semiconductor transistors, one type of III-V nitride semiconductor device developed in electronic and optoelectronic applications. However, the processing steps described herein are generally intended to be applicable for forming oxide compounds from any group III-V nitride semiconductor elements.

In the description hereafter, a group III-V nitride semiconductor element means GaN, InGaN, AlGaN, InAlGaN or the like.

Figure 1A:
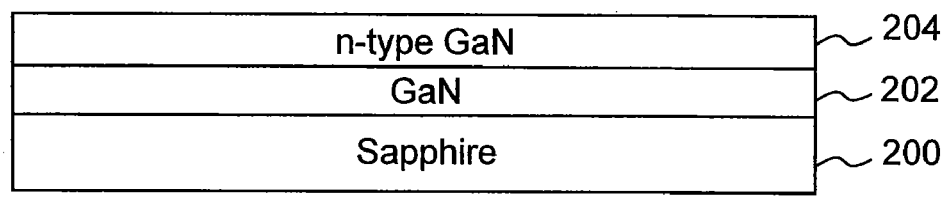
FIG. 1A is a schematic view of an initial stage in a method of forming a group III-V nitride semiconductor device according to an embodiment of the invention.

FIGS. 1A~1F are schematic views describing a method of forming a group III-V nitride semiconductor device according to an embodiment of the invention. FIG. 1A illustrates an intermediate starting stage in which a buffer layer 202 and an n-type group III-V nitride semiconductor layer 204 are formed on a substrate 200. In the illustrated embodiment, the buffer layer 202 can be exemplary made of GaN deposited by a metal organic chemical vapor deposition process on a sapphire substrate 200, while the layer 204 can be an n-type GaN layer doped with silicon impurities. The n-type GaN layer 204 can be configured as an active region where electron and hole channeling occurs in the operation of the semiconductor device.

Figure 1B:
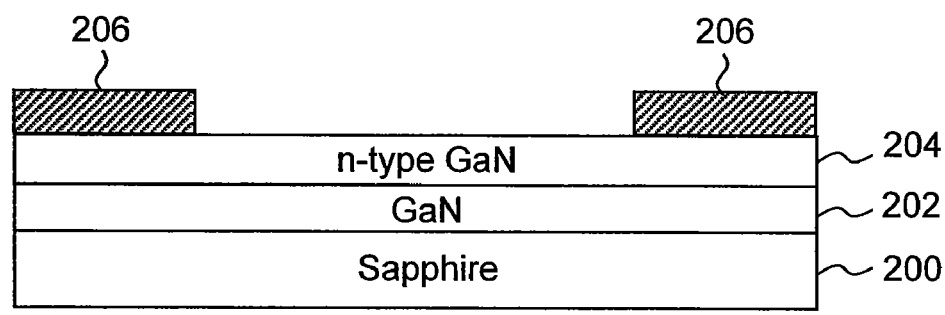
FIG. 1B is a schematic view of a preparatory stage in a method of forming a group III-V nitride semiconductor device according to an embodiment of the invention.

FIG. 1B is a schematic view illustrating the preparation of the substrate for a photo-assisted electrochemical process according to an embodiment of the invention. A cathode pattern 206 is formed on the surface of the n-type GaN layer 204 to serve as cathode contact layers in the photo-assisted electrochemical process. The uncoated GaN portion serves as a local anode to facilitate the oxidation of GaN in the photo-assisted electrochemical process. In an embodiment, the cathode pattern 206 can include aluminum formed by evaporation deposition.

Figure 1C:
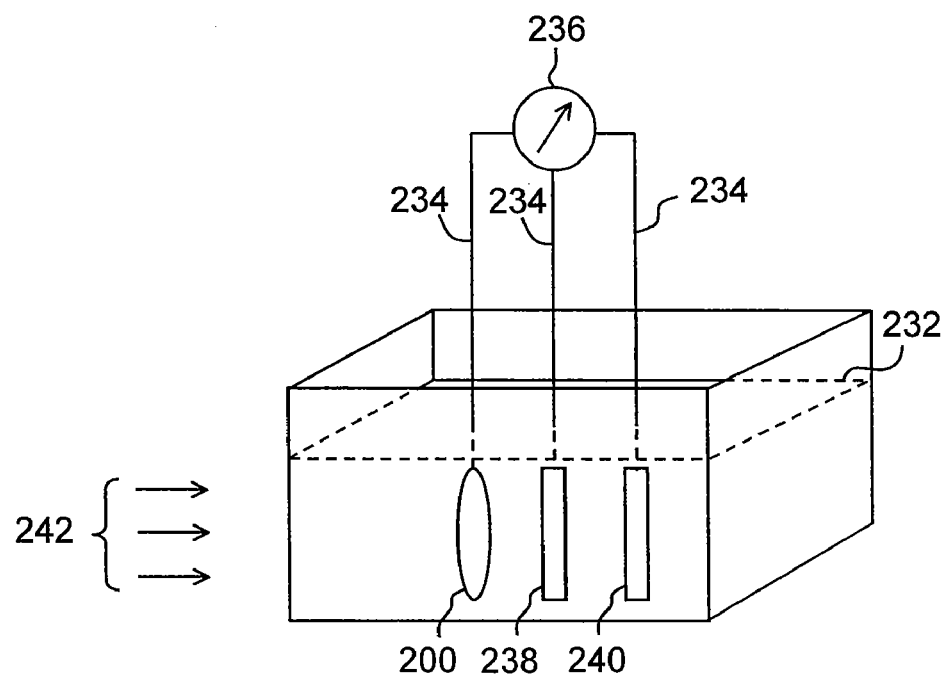
FIGS. 1C and 1D are schematic views illustrating a photo-assisted electrochemical process implemented in a method of forming a group III-V nitride semiconductor device according to an embodiment of the invention.

FIG. 1C illustrates a photo-assisted electrochemical process performed according to an embodiment of the invention to grow a layer of gallium oxide $Ga_2O_3$ over a GaN layer. The substrate 200 is immersed in an electrolyte bath 232 while the cathode pattern 206 is electrically connected via a wire 234 to an electrometer 236. Reference electrode 238 and counter electrode 240, being connected via wires 234 to the electrometer 236, are also immersed in the electrolyte bath 232. The reference electrode 238 provides a reference voltage from which a potential bias between the substrate 200 and electrolyte bath 232 can be controlled. For an n-type nitride layer to be immersed in the electrolyte, the potential bias can be disconnected while the electrolyte includes buffered acetic acid (CH3COOH).

The electrolyte bath 232 includes a liquid solution of acetic acid (CH3COOH) buffered with CH3COONH4 to an electrolyte pH value in a general range between about 5.5 and 7.5. In one implemented embodiment, CH3COOH and CH3COONH4 can be specifically combined so as to obtain an electrolyte pH between about 6.3 and 6.5. The substrate 200 is immersed in the electrolyte bath 232 while mercury light 242 of a wavelength between about 250 nm and 260 nm, exemplary 253.7 nm in one embodiment, is irradiated on the substrate 200. The time of immersion depends on the desired thickness of gallium oxide to be formed. In an example of implementation, for a substrate irradiated with a 253.7 nm mercury light of 10 mW/cm2 intensity, the oxidation rate of n-type GaN layer immersed in a buffered acetic acid CH3COOH electrolyte of pH=6.3 can be about 15 nm/min; in this embodiment, a cathode pattern of plural aluminum thin lines with 50 □m width, 100 nm thickness, and 400 μm spacing are exemplary evaporated onto the GaN surface.

Figure 1D:
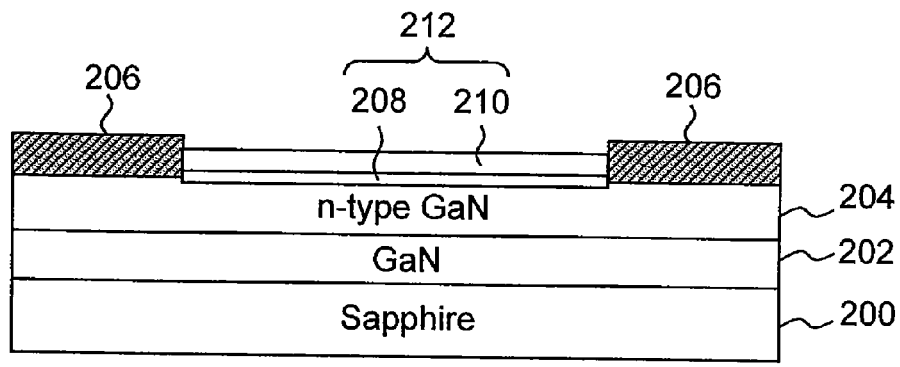

Referring to FIG. 1D, the photo-assisted electrochemical process grows a gallium oxynitride layer 208 (generally represented by the expression GaOxNy) and a gallium oxide layer 210 over the n-type GaN layer 204, wherein the gallium oxynitride layer 208 is formed at the interface between the n-type GaN layer 204 and the gallium oxide layer 210. The gallium oxynitride layer 208 and gallium oxide layer 210 compose a gate-insulating layer 212.

Measure by x-ray photoemission spectrometer shows that the gallium oxynitride layer 208 has a graded composition varying from about $GaO_{0.18}N_{0.82}$ in proximity of the n-type GaN layer 204 to about $GaO_{0.82}N_{0.18}$ in proximity of the gallium oxide layer 210. This graded composition configures the gallium oxynitride layer 208 as a strain-relief layer that promotes the growth of gallium oxide during the photo-assisted electrochemical process.

Figure 1E:
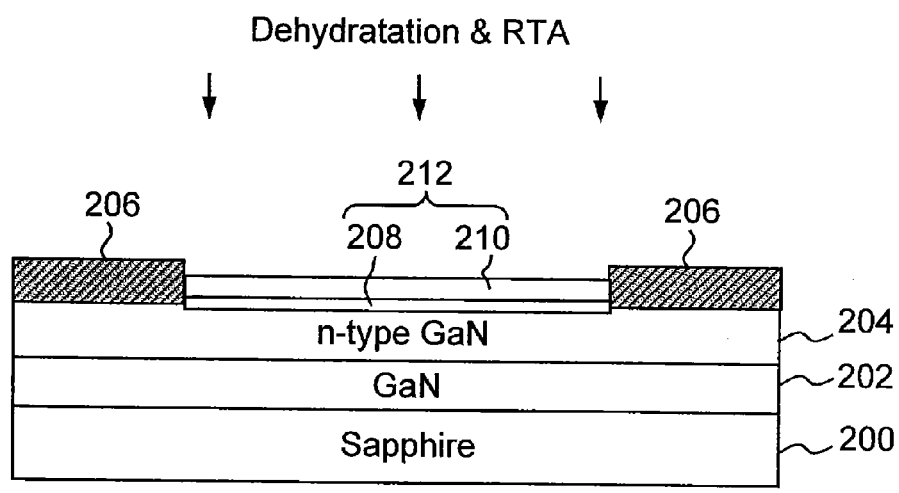
FIG. 1E is a schematic view illustrating a rapid thermal annealing process in a method of forming a group III-V nitride semiconductor device according to an embodiment of the invention.

Referring to FIG. 1E, after the photo-assisted electrochemical process is completed, the substrate 200 is dehydrated at a temperature of about 400° C. for one hour. Subsequently, rapid thermal annealing (RTA) then is conducted in O2 environment at a temperature between about 500° C. and 800° C. for 5 minutes. The temperature of the RTA process is a principal factor determining the final thickness of the gallium oxynitride layer 208. In one embodiment, the thickness of the gallium oxynitride layer 208 obtained after rapid thermal annealing is between about 20 nm and 30 nm, while the total thickness of the gate-insulating layer 212 is between about 150 nm and 200 nm. The relatively thin gallium oxynitride layer 208 contributes to relieve the large lattice mismatch (about 56%) between the gate-insulating layer 212 and the n-type GaN layer 204, and thereby provide improved capacitance and electrical performance.

Figure 1F:
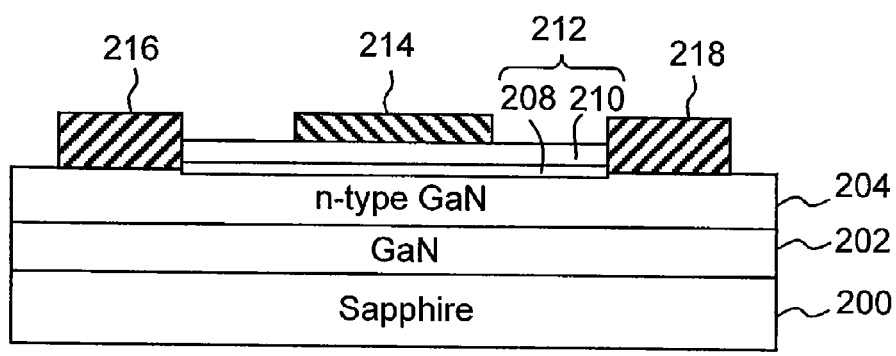
FIG. 1F is a schematic view illustrating the formation of a gate electrode and ohmic contact layers in a method of forming a group III-V nitride semiconductor device according to an embodiment of the invention.

Referring to FIG. 1F, after the gate-insulating layer 212 is formed, the cathode pattern 206 is removed. A gate electrode 214 is formed on the gate-insulating layer 212, while ohmic electrodes 216, 218 are formed on a surface of the n-type GaN layer 204 apart from the gate electrode 214 to complete the structure of the transistor device. The gate electrode 214 and ohmic electrodes 216, 218 can be formed via adequately etching the gate-insulating layer 212 followed with depositing metallic materials including Al, Ti, Pt, Au or the like. Suitable metallic deposition techniques can include a deposition by evaporation, sputtering, plating or the like.

Tests on the semiconductor device formed according to the aforementioned methodology show that it exhibits improved characteristics. In particular, the gate-insulating layer has a forward breakdown field higher than 15 MV/cm, and a low interface state density of about $2 \times 10^{11}$ cm-2-eV-1. These factors contribute to eliminate gate leakage and allow stable high power operating voltages of the semiconductor device.

The person skilled in the art of gallium-based semiconductor manufacture will appreciate that many variations of the invention as described above can be envisioned.

In another embodiment not illustrated, the ohmic contact layers can be formed, for example, via leaving portions of the cathode pattern used during the photo-assisted electrochemical process instead of conducting a deposition step of metals.

Though the embodiments herein specifically illustrate the manufacture of a group III-V nitride semiconductor device, the methodology described herein for forming the gate insulator may be also applicable in the manufacture of other types of semiconductor devices such as metal-insulator semiconductor devices or metal-oxide semiconductor devices.

Realizations in accordance with the present invention therefore have been described in the context of particular embodiments. These embodiments are meant to be illustrative and not limiting. Many variations, modifications, additions, and improvements are possible. Accordingly, plural instances may be provided for components described herein as a single instance. Structures and functionality presented as discrete components in the exemplary configurations may be implemented as a combined structure or component. These and other variations, modifications, additions, and improvements may fall within the scope of the invention as defined in the claims that follow.

What is claimed is:

1. A method of forming an oxide compound on a semiconductor layer, comprising:

conducting a photo-assisted electrochemical process to form the oxide compound layer over the semiconductor layer, wherein the photo-assisted electrochemical process uses an electrolyte bath including buffered acetic acid ($CH_3COOH$); and performing a thermal annealing process.

2. The method according to claim 1, wherein the acetic acid ($CH_3COOH$) is buffered with $CH_3COONH_4$.

3. The method according to claim 1, wherein the electrolyte bath has a pH value between about 5.5 and 7.5.

4. The method according to claim 1, wherein conducting a photo-assisted electrochemical process includes emitting a radiation light having a wavelength between about 250 nm and 260 nm through the electrolyte bath.

5. The method according to claim 1, wherein the thermal annealing process is performed at a temperature between about 500° C. and 800° C.

6. The method according to claim 1, wherein the thermal annealing process is performed in $O_2$ environment.

7. The method according to claim 1, wherein the oxide compound includes gallium oxide, and the semiconductor layer includes gallium nitride.

8. The method according to claim 7, wherein conducting a photo-assisted electrochemical process forms a layer of gallium oxynitride with a graded composition between the gallium oxide layer and the semiconductor layer.

9. The method according to claim 8, wherein the graded composition varies from about $Ga_{0.18}N_{0.82}$ to $Ga_{0.82}N_{0.18}$.

10. The method according to claim 8, wherein the gallium oxynitride layer is formed with a layer thickness between about 20 nm and 30 nm.

* * * * *